United States Patent
Chaudhuri et al.

(10) Patent No.: US 6,788,155 B2
(45) Date of Patent: Sep. 7, 2004

(54) LOW GAIN PHASE-LOCKED LOOP CIRCUIT

(75) Inventors: Santanu Chaudhuri, Moutain View, CA (US); Sanjay Dabral, Palo Alto, CA (US); Karthisha Canagasaby, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/334,276

(22) Filed: Dec. 31, 2002

(65) Prior Publication Data

US 2004/0124884 A1 Jul. 1, 2004

(51) Int. Cl.[7] .................................................. H03L 7/00
(52) U.S. Cl. .............................. 331/46; 331/17; 331/2
(58) Field of Search ................................ 331/46, 17, 2, 331/14; 455/260; 375/376

(56) References Cited

U.S. PATENT DOCUMENTS

| | | | | |
|---|---|---|---|---|
| 6,583,675 B2 | * | 6/2003 | Gomez | 331/17 |
| 6,687,320 B1 | * | 2/2004 | Chiu et al. | 375/376 |
| 2001/0016476 A1 | * | 8/2001 | Kasahara et al. | 455/260 |
| 2002/0062416 A1 | * | 5/2002 | Kim et al. | 710/305 |
| 2002/0087901 A1 | * | 7/2002 | Cooper et al. | 713/320 |
| 2002/0130725 A1 | * | 9/2002 | Han | 331/46 |

* cited by examiner

Primary Examiner—Robert Pascal
Assistant Examiner—Joseph Chang
(74) Attorney, Agent, or Firm—Buckley, Maschoff & Talwalkar LLC (57) ABSTRACT

A low gain phase-locked loop circuit comprising a phase detector, a plurality of voltage controlled oscillators, wherein each voltage controlled oscillator is selectable to provide an output clock signal based at least in part on information generated by the phase detector; and a multiplexer to output a signal generated by one of the voltage controlled oscillators as the output clock signal based on a multi-bit selection control signal.

12 Claims, 11 Drawing Sheets

LOW GAIN PHASE-LOCKED LOOP CIRCUIT

BACKGROUND

Figure 1:
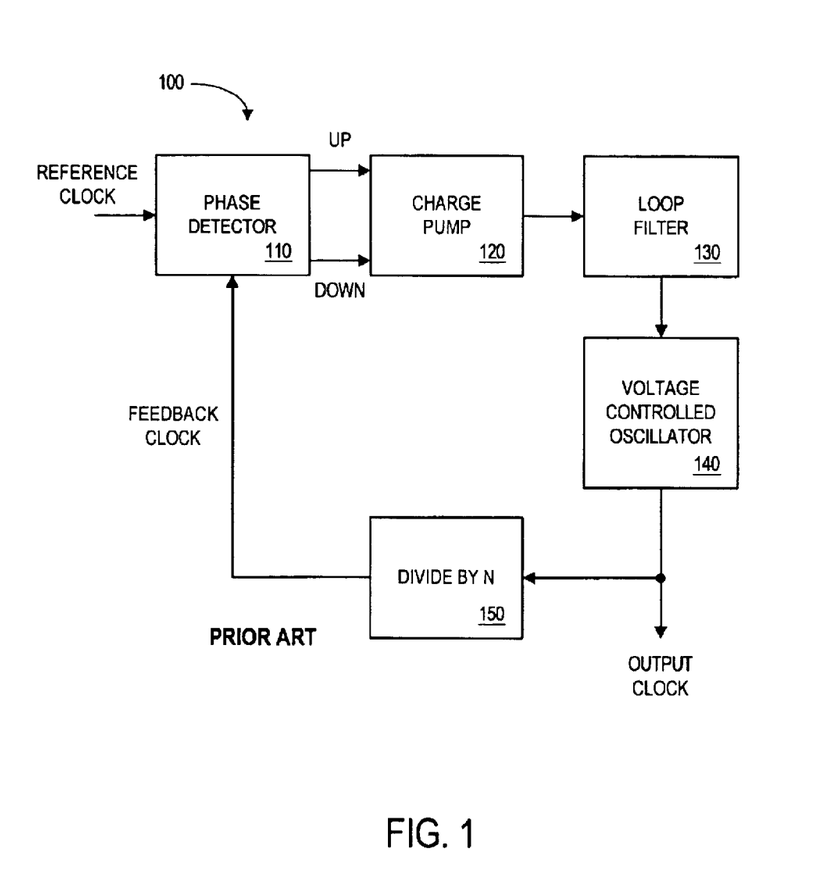
FIG. 1 is a block diagram of a known PLL circuit.

A Phase-Locked Loop (PLL) circuit can be used to generate an output clock signal based on a reference clock signal. For example, FIG. 1 is a block diagram of a known PLL circuit 100. The PLL circuit 100 includes a phase detector 110 that receives a reference clock signal and a feedback clock signal. Based on a difference between these two signals (e.g., a difference in phase or frequency), the phase detector 110 provides up and down signals to a charge pump 120. A Voltage Controlled Oscillator (VCO) 140 generates an output clock signal at a frequency that is based on a signal received from the charge pump 120. That is, an up signal from the phase detector 110 will cause the VCO 140 to increase the frequency of the output clock signal (and a down signal will cause the VCO 140 to decrease the frequency). A divider 150 divides the output clock signal by N to create the feedback clock signal that is provided to the phase detector 110. A loop filter 130 between the charge pump 120 and the VCO 140 may filter a high frequency signal from the charge pump 120 to create a lower frequency signal that can be used to control the VCO 140.

The frequency of the output clock signal generated by the PLL circuit 100 will initially vary. Eventually, however, the PLL circuit 100 "locks" and the output clock signal remains at an appropriate frequency (e.g., based on the frequency of the reference clock signal and the value of N).

Even after the PLL circuit 100 achieves lock, the output clock signal may contain an amount of "jitter" (i.e., variations in the clock signal's rising and falling edges as compared to an ideal clock signal). Note that output jitter may a limiter for embedded clock data recovery based serial links, and thus should be reduced.

In general, the amount of jitter in the output clock signal is related to the overall gain of the PLL circuit 100. In particular, a PLL circuit 100 with a higher gain will have a larger amount of jitter as compared to a PLL circuit with a lower gain in the regime where reference clock jitter is the determinant one and an internal PLL needs it small.

The gain of individual elements in the PLL circuit 100 contribute to the overall gain of the PLL circuit 100. For example, the gain of the VCO 140 will contribute to the overall gain (and jitter) of the PLL circuit 100. Thus, reducing the gain of the VCO 140 will lead to reduced jitter. However, reducing the gain of the VCO 140 will also reduce the range of frequencies at which the VCO 140 can operate—resulting a less versatile PLL circuit 100. Moreover, a PLL circuit 100 associated with an Input Output (IO) system may need to operate at a large range of frequencies (e.g., because of differences that may exist between the PLL circuits in a transmitting device and a receiving device).

The gain of the charge pump 120 also contributes to the overall gain (and jitter) of the PLL circuit 100. Note, however, that a charge pump 120 with a higher gain will achieve lock faster than a charge pump 120 that has a lower gain. That is, reducing the gain associated with the charge pump 120 will cause the PLL circuit 100 to achieve lock more slowly (or even prevent lock from being achieved at all).

DETAILED DESCRIPTION

Several embodiments of PLL circuits and methods will now be described. Note that the flow charts described herein do not necessarily imply a fixed order to the actions, and embodiments may be performed in any order that is practicable.

Multiple Voltage Controlled Oscillators

Figure 2:
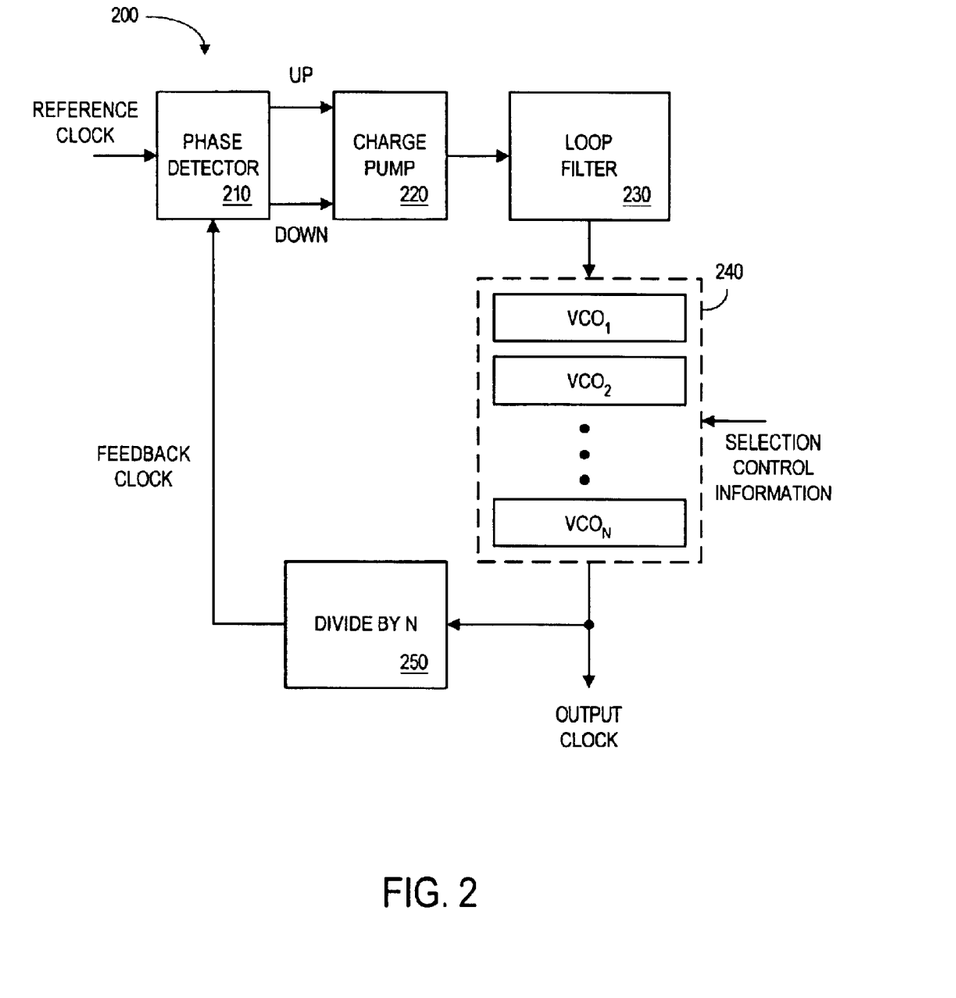
FIG. 2 is a block diagram of a PLL circuit with multiple VCOs according to some embodiments.

FIG. 2 is a block diagram of a PLL circuit 200 with multiple VCOs according to some embodiments. As in the traditional circuit, a phase detector 210 receives a reference clock signal and a feedback clock signal. Based on a difference between these two signals (e.g., a difference in phase or frequency), the phase detector 210 provides up and down signals to a charge pump 220.

According to this embodiment, the PLL circuit 200 includes multiple VCOs 240 (i.e., $VCO_1$ through $VCO_N$). Selection control information determines which of the VCOs 240 will be used to generate an output clock signal (e.g., at a frequency that is based on a signal received from the charge pump 220 via a loop filter 230). As before, a divider 250 divides the output clock signal by N to create the feedback clock signal that is provided to the phase detector 210.

Figure 3:
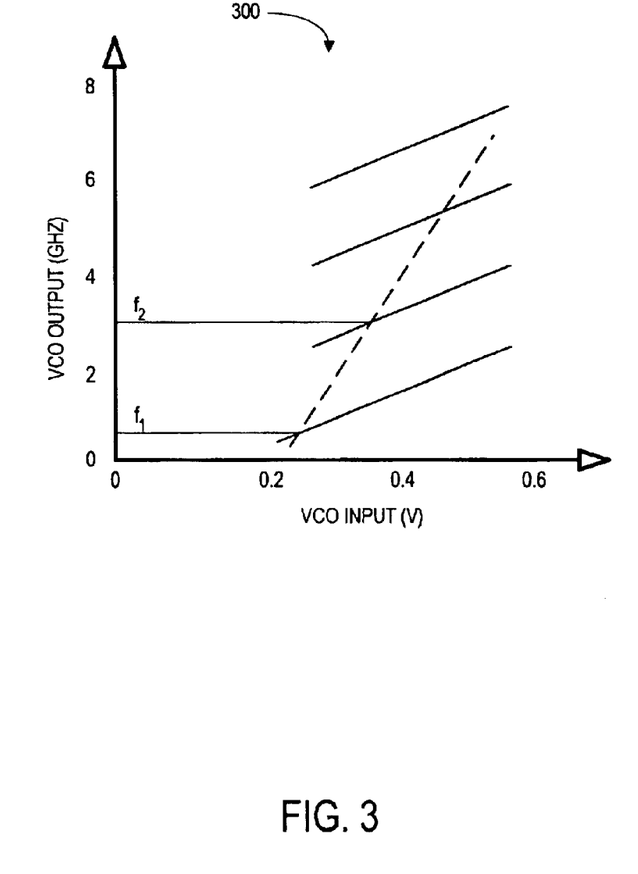
FIG. 3 is a graph illustrating VCO frequency ranges according to some embodiments.

Each of the individual VCOs 240 may be associated with a different frequency range. For example, FIG. 3 is a graph illustrating VCO frequency ranges according to some embodiments. A traditional VCO (shown as a dashed line in FIG. 3) may operate at a wide range of frequencies. Although such a traditional VCO may be versatile, it can introduce significant jitter to a PLL circuit for a jittery input clock.

According to this embodiment, the traditional VCO is replaced with multiple VCOs, each of which is adapted to operate at a different range of frequencies (as illustrated by the four solid lines in FIG. 3). Note that as a group, the multiple VCOs may still cover the same range of frequencies as the traditional VCO (enabling an equally versatile PLL circuit). Because each individual VCO is associated with a smaller frequency range, however, it may introduce less gain and jitter to a PLL circuit.

Figure 4:
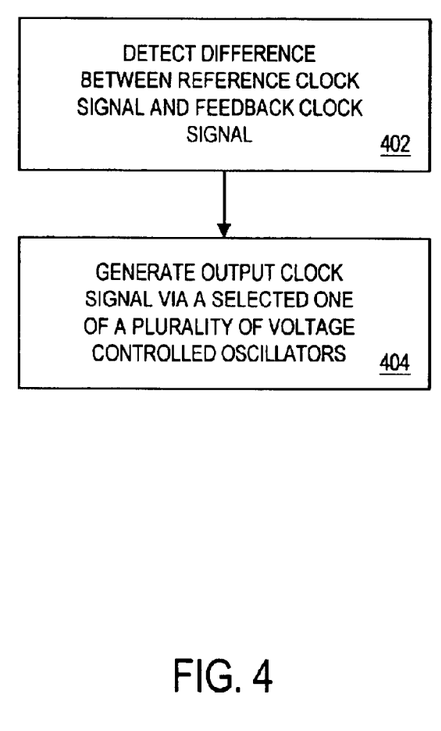
FIG. 4 is a flow chart of a method according to some embodiments.

FIG. 4 is a flow chart of a method according to some embodiments. The method may be associated with, for example, the PLL circuit 200 illustrated in FIG. 2. At 402, a difference between a reference clock signal and a feedback clock signal is detected. For example, the phase detector 210 may generate up and down signals based on a phase or frequency difference between the two clock signals.

At 404, an output clock signal is generated via a selected one of a plurality of voltage controlled oscillators based at least in part on the detected difference. For example, selection control information may be used to select one of the VCOs 240. The selected VCO 240 would then generate the output clock signal based on at least in part on the up and down signals generated by the phase detector 210 (e.g., after the information passes through the charge pump 220 and the loop filter 230).

Figure 5:
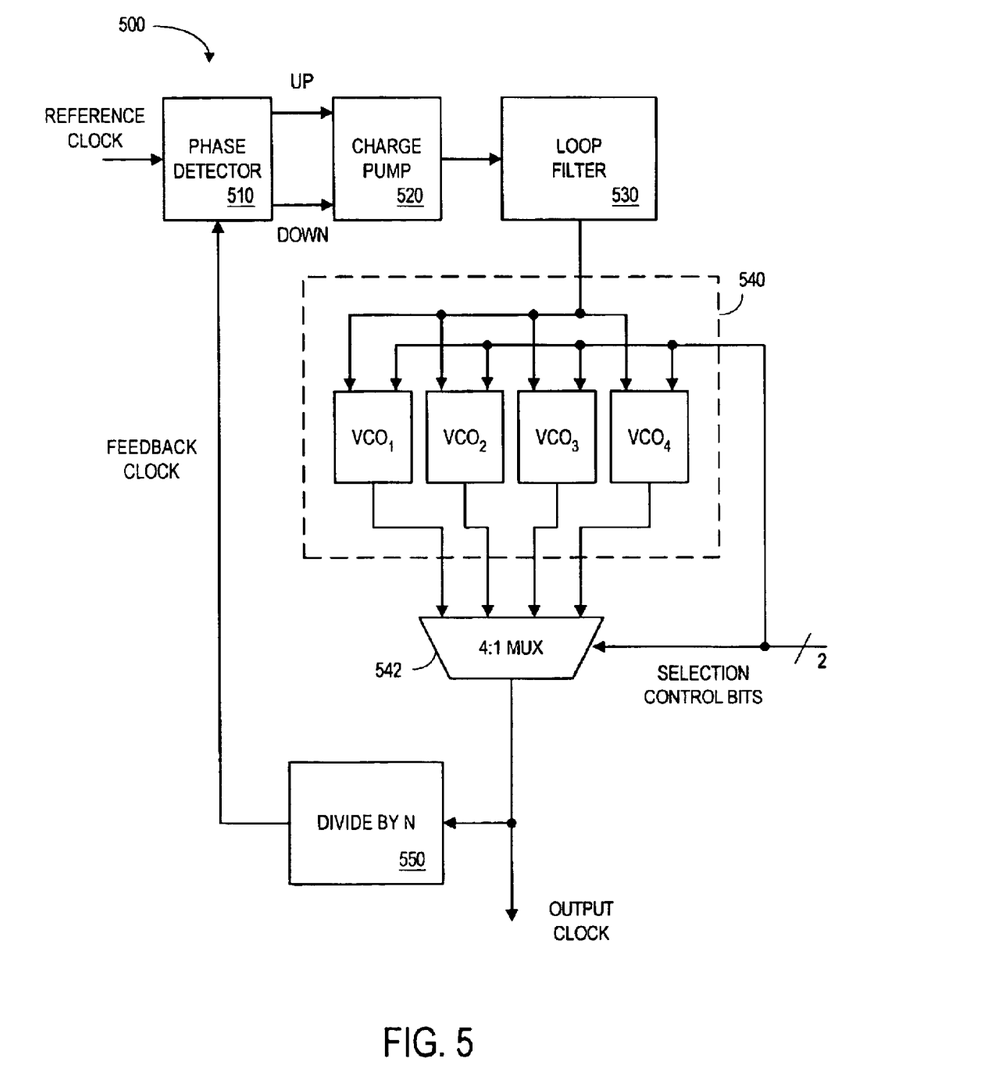
FIG. 5 is a more detailed diagram of a PLL circuit with multiple VCOs according to some embodiments.

FIG. 5 is a more detailed diagram of a PLL circuit 500 with multiple VCOs according to some embodiments. Note that the phase detector 510, charge pump 520, loop filter 530, and divider 550 may operate as described with respect to FIG. 2.

In this case, the PLL circuit 500 includes four VCOs 540 (i.e., $VCO_1$ through $VCO_4$). Each VCO 540 receives a signal from the loop filter 530 and provides a clock signal to a 4:1 multiplexer 542. Two selection control bits determine which one of those four VCO outputs is provided from the multiplexer 542 as the output clock signal. The selection control bits may be set in accordance with the frequency range associated with each VCO 540 and the desired operation of the PLL circuit 500. That is, the clock signal from $VCO_1$ might be selected if the output clock signal will have a frequency of $f_1$ while the clock signal from $VCO_2$ would be selected instead if the output clock signal was going to have a frequency of $f_2$, as indicated in FIG. 3.

Note that in this embodiment the selection control bits are also provided to the VCOs 540. For example, the selection control bits might turn off the VCOs 540 that do not need to generate clock signals. Such an approach may prevent unnecessary power dissipation.

Figure 6:
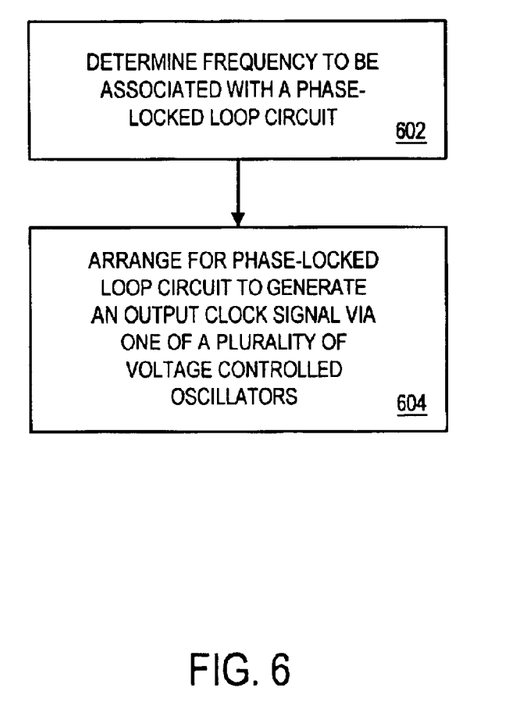
FIG. 6 is a flow chart of a method of setting selection control bits according to some embodiments.

FIG. 6 is a flow chart of a method of setting the selection control bits according to some embodiments. At 602, a frequency to be associated with a PLL circuit is determined. It is then arranged at 604 for the PLL circuit to generate an output clock signal via one of a plurality of VCOs. The method of FIG. 6 may be performed, for example, via a test operation and/or information associated with a Joint Test Action Group (JTAG) scan. The method may also be performed via firmware and/or programming. For example, a medium may store instructions adapted to be executed by a processor to perform the method of FIG. 6.

Adjustable Gain Charge Pump

Figure 7:
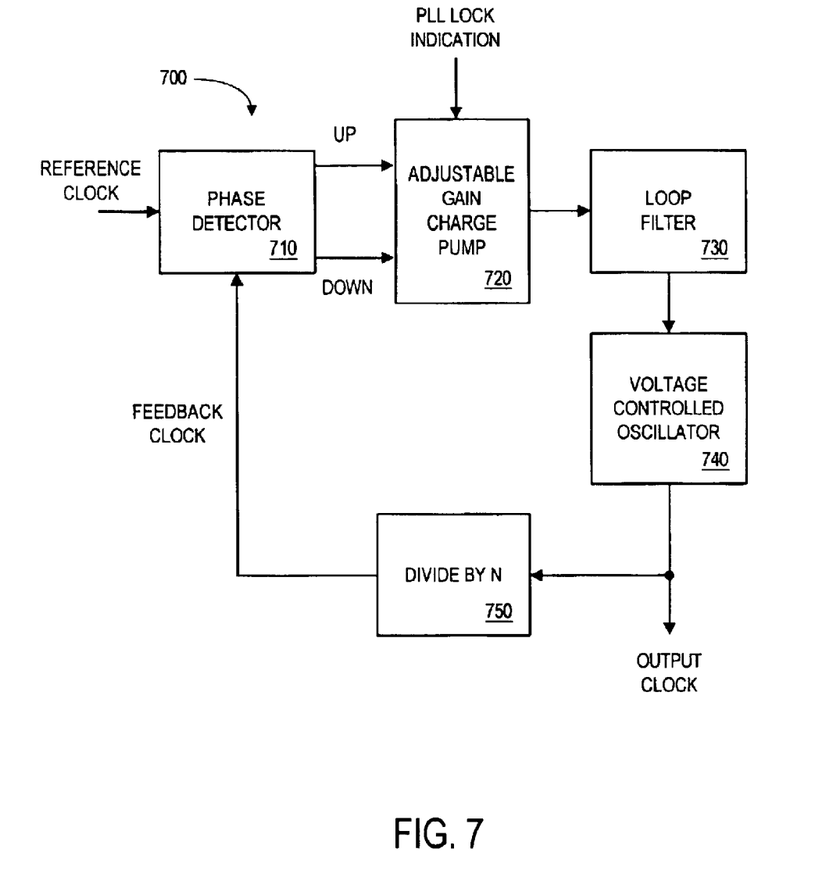
FIG. 7 is a block diagram of a PLL circuit with an adjustable gain charge pump according to some embodiments.

FIG. 7 is a block diagram of a PLL circuit 700 with an adjustable gain charge pump according to some embodiments. Note that the phase detector 710, loop filter 730, VCO 740, and divider 750 may operate as described with respect to FIG. 2.

According to this embodiment, an adjustable gain charge pump 720 receives a PLL lock indication. When the PLL lock indication reflects that the PLL circuit 700 has yet to achieve lock, the charge pump 720 is associated with a higher gain (e.g., to help the PLL circuit 700 achieve lock more quickly). When the PLL lock indication reflects that the PLL circuit 700 has achieved lock, the charge pump 720 is associated with a lower gain (e.g., to reduce the amount of jitter in the output clock signal). Note that a lower gain charge pump may mean a lower charge pump current to the loop filter.

Figure 8:
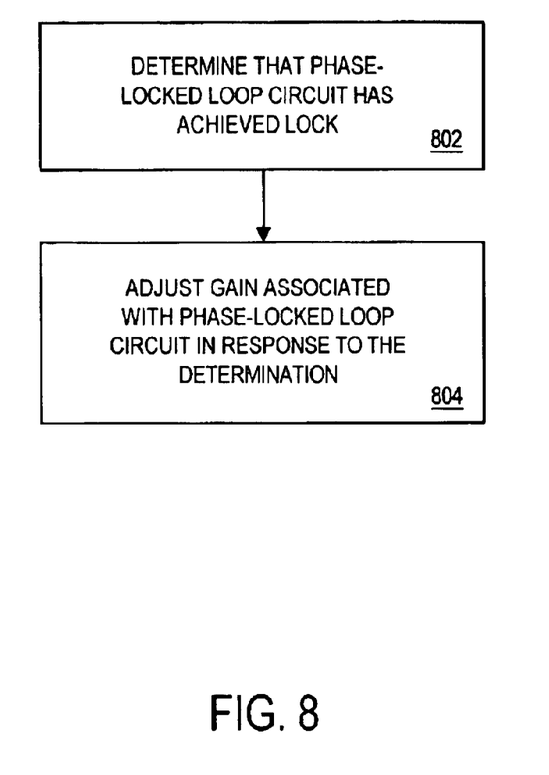
FIG. 8 is a flow chart of a method according to some embodiments.

FIG. 8 is a flow chart of a method according to some embodiments. The method may be associated with, for example, the PLL circuit 700 illustrated in FIG. 7. At 802, it is determined that a PLL circuit has achieved lock. A gain associated with the PLL circuit is then adjusted at 804 in response to the determination. For example, the gain of an adjustable gain charge pump 720 might be decreased in response to the determination. According to another embodiment, the gain of an adjustable gain loop filter is decreased.

Figure 9:
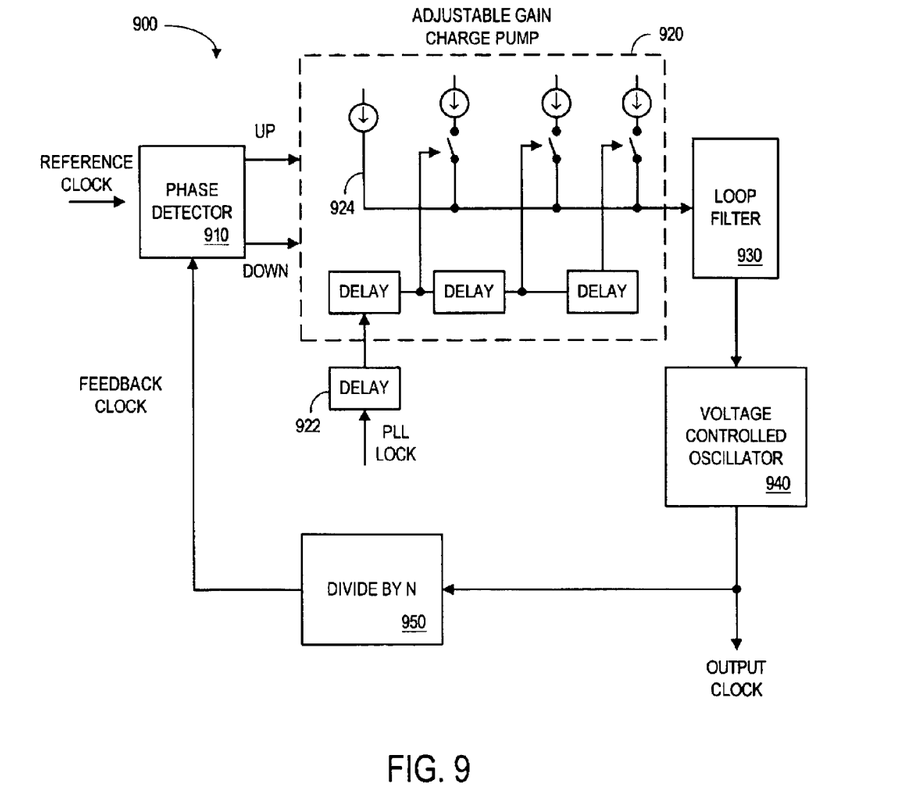
FIG. 9 is a more detailed diagram of a PLL circuit with an adjustable gain charge pump according to some embodiments.

FIG. 9 is a more detailed diagram of a PLL circuit 900 with an adjustable gain charge pump according to some embodiments. Note that the phase detector 910, loop filter 930, VCO 940, and divider 950 may operate as described with respect to FIG. 2.

An adjustable gain charge pump 920 includes a number of output stages 924. In particular, each of the four output stages 924 illustrated in FIG. 9 includes a current source. Moreover, three of the four output stages 924 can be turned on or off via a switch. In this way, the gain associated with the charge pump 920 can be adjusted (i.e., turning off output stages 924 will reduce the gain).

A PLL lock signal propagates through a number of delay elements 922, such as elements that each introduce a 10 microsecond ($\mu$sec) delay. Recall that after the PLL circuit 900 achieves lock, the gain of the charge pump 920 will be lowered (i.e., to reduce the jitter in the output clock signal). Suddenly lowering the gain by too large of an amount too quickly, however, might cause the PLL circuit 900 to lose lock entirely. To reduce this possibility, the delay elements 922 gradually reduce the gain associated with the charge pump 920 (i.e., additional output stages 924 are turned off one-by-one as the PLL lock signal propagates through the delay elements 922). In the event that the PLL circuit 900 goes out of lock, the PLL lock signal indication causes the charge pump 920 to be restored to its high gain state in order to help enable lock.

EXAMPLE

Figure 10:
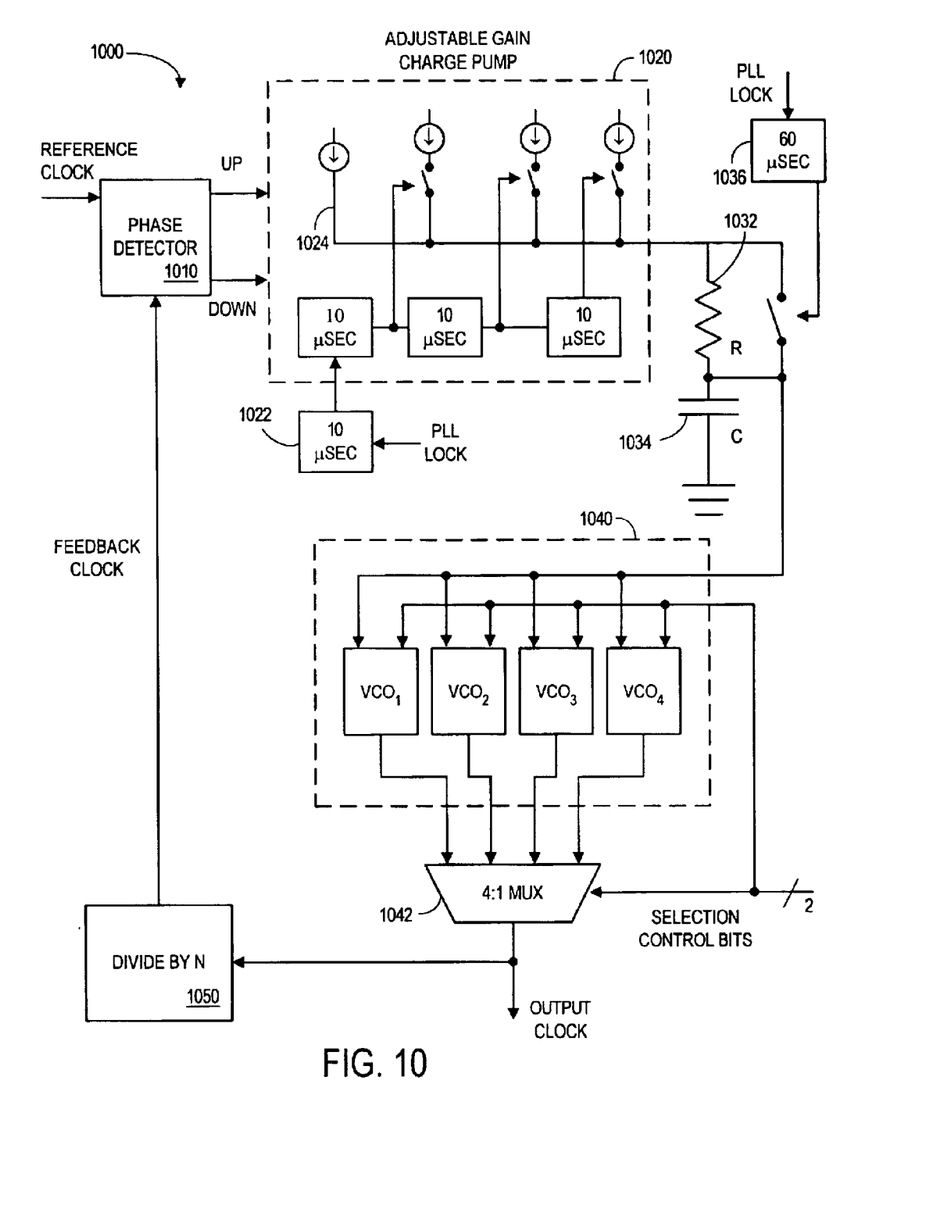
FIG. 10 is an example of a PLL circuit with multiple VCOs and an adjustable gain charge pump according to some embodiments.

FIG. 10 is an example of a PLL circuit 1000 with multiple VCOs and an adjustable gain charge pump according to some embodiments. Note that the phase detector 1010 and divider 1050 may operate as described with respect to FIG. 2.

An adjustable gain charge pump 1020 includes four current source stages 1024, three of which can be turned on or off via a switch. Initially (i.e., before the PLL circuit 1000 achieves lock), all of the output stages 1024 are turned on. As a result, the gain of the charge pump 1020 is increased and the PLL circuit 1000 can achieve lock more quickly.

After lock is achieved, a PLL lock signal is provided to a 10 $\mu$sec delay element 1022. After the signal passes through two delay elements 1022 (i.e., after 20 $\mu$sec), one of the output stages 1024 is turned off (i.e., to slightly lower the gain). Another output stage is turned off after another 10 $\mu$sec, and a third output stage is turned off after another 10 $\mu$sec. Thus, the gain associated with the charge pump 1020 is gradually reduced after the PLL circuit 1000 achieves lock.

To further improve the performance of the PLL circuit 1000, a low-pass loop filter is provided via a resistor 1032 and a capacitor 1034 connected in series between the output of the charge pump 1020 and ground. Moreover, a switch can be closed to remove the resistor 1032 from the loop filter. Before the PLL circuit 1000 achieves lock, the switch is closed—increasing the gain of the PLL circuit 1000 (and helping the PLL circuit 1000 achieve lock more quickly). After lock is achieved, a PLL lock signal opens the switch after passing through a 60 $\mu$sec delay element 1036 (reducing the gain of the PLL circuit 1000 and the amount of jitter in the output clock signal). That is, increased resistive damping is introduced after lock to guard against jitter.

Note that all of the switches (i.e., in the charge pump 1020 and the loop filter) may be reset to the closed position should the PLL circuit 1000 lose lock for any reason (i.e., to increase the gain of the PLL circuit 1000 so that lock can be restored more quickly).

The output of the loop filter is provided to four VCOs 1040 (e.g., each associated with a different frequency range), each of which may provide a clock signal to a 4:1 multiplexer 1042. Two selection control bits determine which of those four clock signals is provided from the multiplexer 1042 as the output clock signal. The selection control bits are also provided to the VCOs 1040.

Thus, some embodiments may provide a low gain (and thus low jitter) PLL circuit which yet preserves a wide operational range and a capability to achieve lock quickly. Such a PLL circuit may, for example, improve the performance of an IO system or a Central Processing Unit (CPU) associated with the output clock signal.

System

Figure 11:
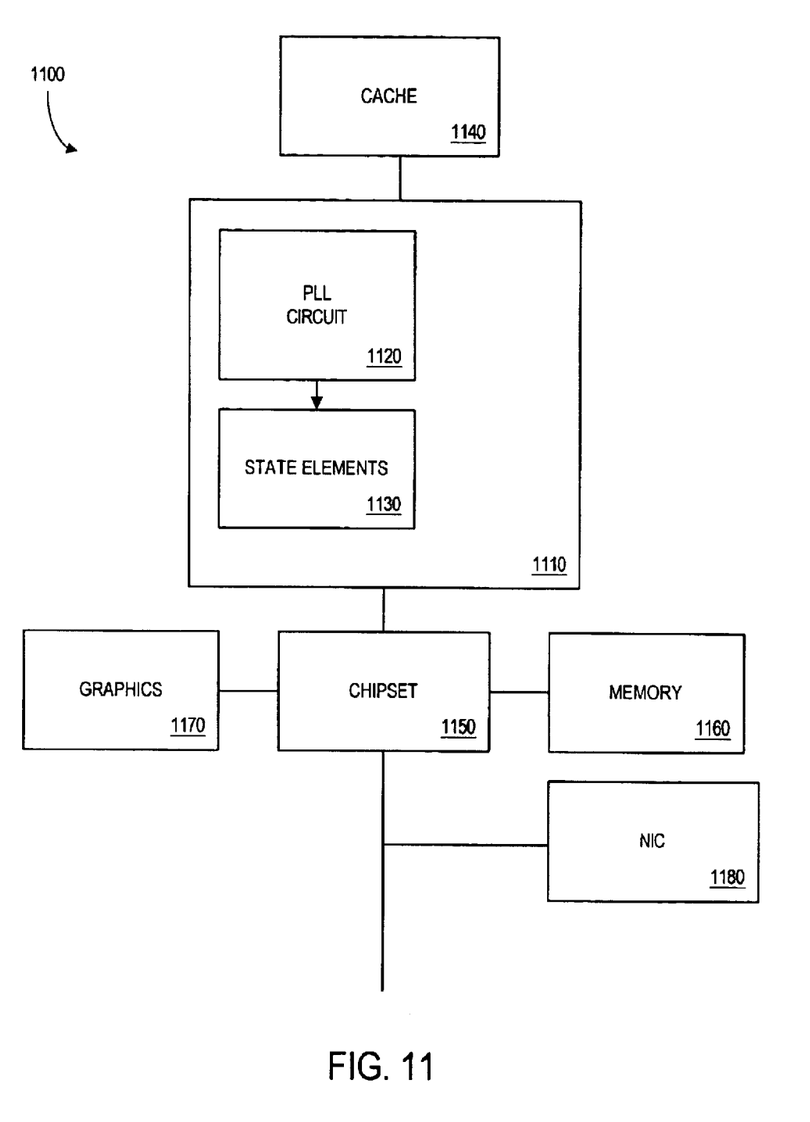
FIG. 11 is a system including an integrated circuit according to some embodiments.

FIG. 11 is a system 1100 including an integrated circuit 1110 with a PLL circuit 1120 that provides a clock signal to state elements 1130 according to some embodiments. The integrated circuit 1110 may be a microprocessor or another type of integrated circuit. According to some embodiments, the integrated circuit 1110 also communicates with an off-die cache 1140. The integrated circuit 1110 may also communicate with a system memory 1160 via a host bus and a chipset 1150. In addition, other off-die functional units, such as a graphics accelerator 1170 and a Network Interface Controller (NIC) 1180 may communicate with the integrated circuit 1110 via appropriate busses.

The PLL circuit 1120 may be associated with any of the embodiments disclosed herein, including those of FIGS. 2 through 10.

Additional Embodiments

The following illustrates various additional embodiments. These do not constitute a definition of all possible embodiments, and those skilled in the art will understand that many other embodiments are possible. Further, although the following embodiments are briefly described for clarity, those skilled in the art will understand how to make any changes, if necessary, to the above description to accommodate these and other embodiments and applications.

Although specific circuits and components have been described herein, other embodiments may use other circuits and/or components (e.g., delay elements with different delays may be more appropriate for a specific PLL circuit).

Further, although software or hardware are described as performing certain functions herein, such functions may be performed using either software or hardware—or a combination of software and hardware.

The several embodiments described herein are solely for the purpose of illustration. Persons skilled in the art will recognize from this description other embodiments may be practiced with modifications and alterations limited only by the claims.

What is claimed is:

1. A phase-locked loop circuit, comprising:

a phase detector;

a plurality of voltage controlled oscillators, wherein each voltage controlled oscillator is selectable to provide an output clock signal based at least in part on information generated by the phase detector; and a multiplexer to outnut a sianal generated by one of the voltaRe controlled oscillators as the outnut clock sianal based on a multi-bit selection control signal.

2. The phase-locked loop circuit bf claim 1, wherein a first of the voltage controller oscillators is associated with a range of freauencies from F1min to F1max and a second of the voltage controller oscillators is associated with a range of freauencies from F2min to F2max and wherein: F2max is greater than F1max and F1max is greater than or eaual to F2min.

3. The phase-locked loop circuit of claim 1, further comprising:

a charge-pump to receive up and down signals from the phase detector;

a loop filter coupled between the charge pump and the voltage controlled oscillators; and a divider to divide the output clock signal by N and to provide the result to the phase detector as a feedback clock signal.

4. The phase-locked loop circuit of claim 3, wherein the phase detector is to generate the up and down signals based on a difference between a reference clock signal and the feedback clock signal.

5. The phase-locked loop circuit of claim 1, wherein the information associated with the multi-bit selection control signal is further provided to the voltage controlled oscillators.

6. The phase-locked loop circuit of claim 1, wherein the multi-bit selection control signal is determined via at least one of: (i) a test operation, (ii) firmware, (iii) programming, and (iv) information associated with a Joint Test Action Group scan.

7. A method, comprising:

detecting a difference between a reference clock signal and a feedback clock signal;

setting a multi-bit control signal to select one of a plurality of voltane controlled oscillators; and generating an output clock signal via the selected voltage controlled oscillator based at least in part on the detected difference.

8. The method of claim 7, wherein a first of the voltage controller oscillators is associated with a range of freauencies from F1min to F1max and a second of the voltage controller oscillators is associated with a range of freauencies from F2min to F2max and wherein: F2max is greater than F1max and F1max is greater than or equal to F2min.

9. A method, comprising:

determining a frequency to be associated with a phase-locked loop circuit;

setting a multi-bit control signal to select one of a plurality of voltaae controlled oscillators; and arranging for the phase-locked loop circuit to generate an output clock signal via the selected voltage controlled oscillator.

10. The method of claim 9, wherein said determining is performed via at least one of: (i) a test operation, (ii) firmware, (iii) programming, and (iv) information associated with a Joint Test Action Group scan.

11. A medium storing instructions adapted to be executed by a processor to perform a method, said method comprising:

determining a frequency to be associated with a phase-locked loop circuit;

setting a multi-bit control signal based on the determined freauencv to select one of a plurality of voltage controlled oscillators; and     arranging for the phase-locked loop circuit to generate an output clock signal via the selected voltage controlled oscillator.

12. The medium of claim 11, wherein said determining is performed via at least one of: (i) a test operation, (ii) firmware, (iii) programming, and (iv) information associated with a Joint Test Action Group scan.

\* \* \* \* \*

UNITED STATES PATENT AND TRADEMARK OFFICE
CERTIFICATE OF CORRECTION

PATENT NO. : 6,788,155 B2
DATED : September 7, 2004
INVENTOR(S) : Chaudhuri et al.

It is certified that error appears in the above-identified patent and that said Letters Patent is hereby corrected as shown below:

Title page,
Item [75], Inventors, "Moutain" should read -- Mountain --.

Column 6,
Line 8, "outnut" should read -- output --; "sianal" should read -- signal --.
Line 9, "voltaRe" should read -- voltage --; "outnut" should read -- output --; "sianal" should read -- signal --.
Line 11, "bf" should read -- of --.
Lines 13 and 15, "freauencies" should read -- frequencies --.
Line 16, "eaual" should read -- equal --.
Line 45, "voltane" should read -- voltage --.
Lines 50-51, "freauencies" should read -- frequencies --.
Lines 52-53, "freauencies" should read -- frequencies --.
Line 60, "voltaae" should read -- voltage --.

Column 7,
Line 7, "freauencv" should read -- frequency --.

Signed and Sealed this

Twenty-sixth Day of April, 2005

JON W. DUDAS
*Director of the United States Patent and Trademark Office*